US012615713B2

(12) United States Patent
Choi

(10) Patent No.: US 12,615,713 B2
(45) Date of Patent: Apr. 28, 2026

(54) CIRCUIT BOARD AND METHOD FOR MANUFACTURING CIRCUIT BOARD

(71) Applicant: SAMSUNG ELECTRO-MECHANICS CO., LTD., Suwon-si (KR)

(72) Inventor: Seong Ho Choi, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 178 days.

(21) Appl. No.: 18/588,729

(22) Filed: Feb. 27, 2024

(65) Prior Publication Data

US 2025/0071896 A1 Feb. 27, 2025

(30) Foreign Application Priority Data

Aug. 25, 2023 (KR) ........................ 10-2023-0111972

(51) Int. Cl.
*H05K 1/11* (2006.01)
*H05K 1/181* (2026.01)
*H05K 3/06* (2006.01)
*H05K 3/10* (2006.01)
*H05K 3/18* (2006.01)

(52) U.S. Cl.
CPC ............. *H05K 1/111* (2013.01); *H05K 3/061* (2013.01); *H05K 3/108* (2013.01); *H05K 3/18* (2013.01); *H05K 1/181* (2013.01); *H05K 2201/0341* (2013.01); *H05K 2201/0989* (2013.01)

(58) Field of Classification Search
CPC . H05K 1/09; H05K 1/11; H05K 1/111; H05K 1/18; H05K 3/243; H05K 3/4007; H05K 2201/0989
See application file for complete search history.

(56) References Cited

U.S. PATENT DOCUMENTS

| | | | | |
|---|---|---|---|---|
| 2006/0102384 | A1* | 5/2006 | Watanabe | ......... H01L 23/49816 174/257 |
| 2010/0308451 | A1 | 12/2010 | Kodani | |
| 2011/0155438 | A1* | 6/2011 | Ito | ......................... H05K 3/4007 174/261 |
| 2012/0234589 | A1* | 9/2012 | Furuichi | ........... H01L 23/49822 29/837 |
| 2015/0163908 | A1* | 6/2015 | Wang | .................... H05K 3/4007 174/262 |
| 2017/0317017 | A1* | 11/2017 | Ishihara | ........... H01L 23/49827 |

(Continued)

FOREIGN PATENT DOCUMENTS

| | | |
|---|---|---|
| JP | 2005-235824 A | 9/2005 |
| JP | 2010-283044 A | 12/2010 |
| JP | 2011-155199 A | 8/2011 |

*Primary Examiner* — Nathan Milakovich
(74) *Attorney, Agent, or Firm* — Morgan, Lewis & Bockius LLP

(57) ABSTRACT

A circuit board include: a substrate having a first surface including a first region and a second region; a connection pad disposed in the first region and having a first height in a direction perpendicular to the first surface; a circuit wiring disposed in the second region, including different metal films, and having a second height in the direction perpendicular to the first surface to be greater than the first height; and an insulating pattern layer covering the circuit wiring in the second region and protruding from the first surface to have a step from the first region.

20 Claims, 11 Drawing Sheets

(56)     References Cited

U.S. PATENT DOCUMENTS

2019/0252306 A1 *   8/2019   Park .................... H01L 21/6835
2023/0215794 A1 *   7/2023   Hong ................ H01L 23/49838
                                          257/676

* cited by examiner

CIRCUIT BOARD AND METHOD FOR MANUFACTURING CIRCUIT BOARD

CROSS-REFERENCE TO RELATED APPLICATION

This application claims priority to and the benefit of Korean Patent Application No. 10-2023-0111972 filed in the Korean Intellectual Property Office on Aug. 25, 2023, the entire contents of which are incorporated herein by reference.

TECHNICAL FIELD

The present disclosure relates to a circuit board and a method for manufacturing a circuit board.

BACKGROUND

Today, semiconductor technology continues to achieve innovation in terms of performance and size. Recent packaging technologies are pursuing improved connection speeds and integration of various functions. Additionally, due to the increase in mobile devices and wearable electronic products, the need for small size and thin packages is emerging.

Small and thin packages offer two main advantages. First, it increases the portability and wearability of the mobile devices. This creates an environment where consumers may use and connect devices more conveniently. Second, thermal management and energy efficiency may be improved and more functions may be integrated. The small package size optimizes heat dissipation and power consumption to increase product performance and sustainability.

To achieve thinning of the semiconductor package, various electronic elements are integrated, and it is essential to reduce the thickness of the printed circuit board equipped with a multi-layered circuit pattern.

SUMMARY

The present disclosure attempts to provide a circuit board for reducing a thickness of a circuit board by controlling a height of a conductive layer to manufacture a thin semiconductor package, and a method for manufacturing a circuit board.

However, tasks to be solved by embodiments of the present disclosure may not be limited to the above-described task, and may be extended in various ways within a range of technical scopes included in the present disclosure.

An embodiment of the present disclosure provides a board including: a substrate having a first surface including a first region and a second region; a connection pad disposed in the first region and having a first height in a direction perpendicular to the first surface; a circuit wiring disposed in the second region, including heterogeneous metal films, and having a second height in the direction perpendicular to the first surface to be greater than the first height; and an insulating pattern layer covering the circuit wiring in the second region and protruding from the first surface to have a step from the first region.

The connection pad and the circuit wiring may protrude from the first surface.

The circuit wiring may include a copper layer and a nickel layer.

The circuit wiring may include sequentially stacked a first copper layer, a nickel layer, and a second copper layer.

A height of the first copper layer may be equal to a height of the connection pad.

The connection pad may include copper.

The substrate and the insulating pattern layer may include different insulation materials.

The insulating pattern layer may include a solder resist layer.

The circuit wiring may include a signal wiring and a connection portion, and the insulating pattern layer may include an opening to expose an upper surface of the connection portion.

The first region may be adjacent to the second region.

The first region may provide a recess portion surrounded by the insulating pattern layer disposed in the second region.

An electronic element may be disposed in the first region, and the electronic element may be connected to the connection pad.

Another embodiment of the present disclosure provides a method for manufacturing a circuit board including: forming a first conductive layer with a first metal on a first surface of a substrate having a seed layer; forming a second conductive layer on the first conductive layer with a second metal that is different from the first metal; forming a third conductive layer on the second conductive layer with the first metal; defining a first region and a second region that are different from each other on the first surface, and removing the second conductive layer and the third conductive layer disposed in the first region; forming a connection pad in the first region by removing a portion in which the first conductive layer is not formed from the seed layer, and forming a circuit wiring in the second region; and forming an insulating pattern layer covering the circuit wiring in the second region.

The forming of the first conductive layer may include applying a first plating resist to pattern the same, and performing a plating with the first metal to form the first conductive layer, the forming of the second conductive layer may include performing a plating with the second metal to form the second conductive layer, and the forming of the third conductive layer may include performing a plating with the first metal to form the third conductive layer.

The removing of the second conductive layer and the third conductive layer may include covering the second region with second plating resist, and exposing the first region.

The insulating pattern layer may not be formed in the first region.

An embodiment of the present disclosure provides a board including: a substrate; a plurality of connection pads and a plurality of circuit wiring patterns disposed on the substrate; and an insulating pattern layer covering the plurality of circuit wiring patterns and being spaced apart from the plurality of connection pads. A height of one of the plurality of circuit wiring patterns is greater than a height of one of the plurality of connecting pads, and the one of the plurality of circuit wiring patterns has one or more layers more than the one of the plurality of connection pads.

The one of the plurality of circuit wiring patterns may include a copper layer and a nickel layer.

The one of the plurality of circuit wiring patterns may include sequentially stacked a first copper layer, a nickel layer, and a second copper layer.

The one of the plurality of connecting pads and the one of the plurality of circuit wiring patterns each may include a copper layer being in contact with the substrate.

According to the circuit board according to the embodiment, the height of the conductive layer disposed on the substrate may be controlled differently in the region where electronic elements are mounted and other regions to reduce the thickness of the circuit board and achieve thinning of the semiconductor package.

DETAILED DESCRIPTION OF THE EMBODIMENTS

Figure 1:
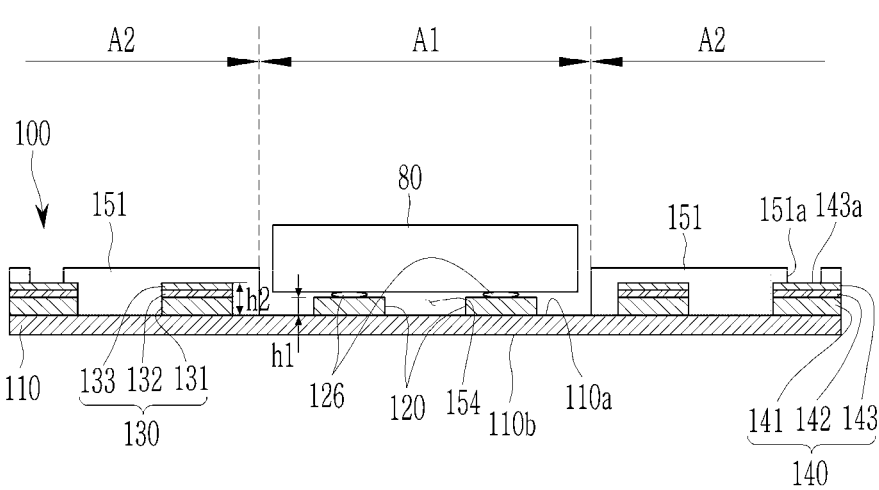
FIG. 1 shows a cross-sectional view of an electronic element package showing an electronic element mounted on a circuit board according to an embodiment.

The present disclosure will be described more fully hereinafter with reference to the accompanying drawings, in which embodiments of the disclosure are shown. The drawings and description are to be regarded as illustrative in nature and not restrictive. Like reference numerals designate like elements throughout the specification. Some constituent elements are exaggerated, omitted, or briefly illustrated in the added drawings, and sizes of the respective constituent elements do not reflect the actual sizes.

The accompanying drawings are provided only to allow embodiments disclosed in the present specification to be easily understood and are not to be interpreted as limiting the spirit disclosed in the present specification, and it is to be understood that the present disclosure includes all modifications, equivalents, and substitutions without departing from the scope and spirit of the present disclosure.

Terms including ordinal numbers such as first, second, and the like will be used only to describe various constituent elements, and are not to be interpreted as limiting these constituent elements. The terms are only used to differentiate one constituent element from other constituent elements.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper surface of the object portion based on a gravitational direction.

It should be understood that the term "include", "comprise", "have", or "configure" indicates that a feature, a number, a step, an operation, a constituent element, a part, or a combination thereof described in the specification is present, but does not exclude a possibility of presence or addition of one or more other features, numbers, steps, operations, constituent elements, parts, or combinations, in advance. Unless explicitly described to the contrary, the word "comprise" and variations such as "comprises" or "comprising" will be understood to imply the inclusion of stated elements but not the exclusion of any other elements.

The phrase "in a plan view" or "on a plane" means viewing a target portion from the top, and the phrase "in a cross-sectional view" or "on a cross-section" means viewing a cross-section formed by perpendicularly cutting a target portion from the side.

Throughout the specification, when it is described that a part is "connected" to another part, the part may be "directly connected" to the other element, may be "connected" to the other part through a third part, or may be connected to the other part physically or electrically, and may be referred to by different titles depending on positions or functions, but respective portions that are substantially integrated into one body may be connected to each other.

FIG. 1 shows a cross-sectional view of an electronic element package showing an electronic element mounted on a circuit board according to an embodiment.

Referring to FIG. 1, the electronic element package may be configured by mounting an electronic element 80 on a circuit board 100 according to the present embodiment. The electronic element 80 may include various types of elements such as active elements, passive elements, or integrated circuits (IC), for example, it may be a semiconductor chip. The circuit board 100 may be used for the semiconductor package and may be configured with a printed circuit board.

The circuit board 100 includes a substrate 110, a connection pad 120 protruding on the substrate 110, and circuit wirings 130 and 140. The substrate 110 may have a first surface 110a and a second side 110b opposing each other, and the first surface 110a may be divided into a first region A1 and a second region A2. The connection pad 120 may be disposed in the first region A1 on the first surface 110a, and the circuit wirings 130 and 140 may be disposed in the second region A2 on the first surface 110a.

The first region A1 and the second region A2 may be adjacent to each other on the first surface 110a of the substrate 110. The first region A1 may be disposed in a center of the first surface 110a in a plan view and the second region A2 may be disposed on respective sides of the first region A1, and the present disclosure is not limited thereto. Relative positions of the first region A1 and the second region A2 may be selected in many ways according to designs of the electronic element package.

The substrate 110 may include a resin insulating layer. The substrate 110 may use a thermo-curable resin such as an epoxy resin, a thermoplastic resin such as a polyimide, or a resin, e.g., a prepreg, to which a reinforcing member such as glass fibers or an inorganic filler is impregnated, and may include a thermo-curable resin and/or a photocurable resin, and it is not limited thereto.

According to the shown embodiment, one surface of the substrate 110 is shown to include the connection pad 120 and the circuit wirings 130 and 140, and without being limited thereto, a greater number of insulating layers and circuit patterns may be included, which also belongs to a range of the present disclosure.

The connection pad 120 and the circuit wirings 130 and 140 may protrude from the first surface 110a of the substrate 110. Regarding a height measured in a direction that is perpendicular to the first surface 110a, the circuit wirings 130 and 140 may be formed higher than the connection pad 120. That is, the connection pad 120 may have a first height h1, the circuit wirings 130 and 140 may have a second height h2, and the second height h2 may be greater than the first height h1.

The circuit wirings 130 and 140 with the second height h2 may include heterogeneous metal films. The circuit wirings 130 and 140 may include copper (Cu) layers 131, 133, 141, and 143 and nickel (Ni) layers 132 and 142. The circuit wirings 130 and 140 may be configured by sequentially stacking the first copper layers 131 and 141, the nickel layers 132 and 142, and the second copper layers 133 and 143 on the first surface 110a of the substrate 110. That is, the circuit wirings 130 and 140 may have a stacking structure of Cu/Ni/Cu. Here, the height of the first copper layers 131 and 141 contacting the first surface 110*a* may be greater than the height of the nickel layers 132 and 142 or the second copper layers 133 and 143.

The connection pad 120 with the first height h1 may be made of a metal film of a single material. The connection pad 120 may include the copper layer, and the copper layer may have a same height as the first copper layers 131 and 141 of the circuit wirings 130 and 140. That is, the first copper layers 131 and 141 of the circuit wirings 130 and 140 and the connection pad 120 may have the same first height h1.

An insulating pattern layer 151 may be disposed in the second region A2 on the first surface 110*a* of the substrate 110. The insulating pattern layer 151 may cover the circuit wirings 130 and 140, and may include an insulation material that is different from the substrate 110. The insulating pattern layer 151 may include a solder resist layer.

The insulating pattern layer 151 made of a solder resist layer functions as a protection layer for protecting an outermost circuit, and is formed for electrical insulation. The insulating pattern layer 151 made of a solder resist layer may be configured with, for example, a solder resist ink, a solder resist film, or a capsuling agent as known to a person skilled in the art, but is not limited thereto.

The insulating pattern layer 151 may be applied to the second region A2 and may have a step from the first region A1. The insulating pattern layer 151 may be applied to be higher than the height of the circuit wirings 130 and 140 in the second region A2, and may not be applied to the first region A1. Hence, a step that is different by the height of the insulating pattern layer 151 may be formed between the first region A1 and the second region A2.

The first region A1 may be surrounded by the second region A2 on the first surface 110*a* of the substrate 110. In this instance, the insulating pattern layer 151 is applied to the second region A2 to have a step from the first region A1 so the first region A1 may provide a recess portion 154 surrounded by the insulating pattern layer 151.

The circuit wirings 130 and 140 covered by the insulating pattern layer 151 may include a signal wiring portion 130 and a connection portion 140. An upper surface 143*a* of the connection portion 140 may be at least partly exposed to be connected to an external circuit. The insulating pattern layer 151 may be partly opened to expose the upper surface 143*a* of the connection portion 140 and may form an opening 151*a*.

The electronic element 80 may be disposed in the first region A1, and may be connected to the connection pad 120 to be electrically connected to the circuit board 100. The electronic element 80 may be bonded to the connection pad 120 through a conductive connection material 126, for example, a solder ball.

The first region A1 may be made of the recess portion 154 at least having a greater area than an area of the electronic element 80. Therefore, the electronic element 80 may be received in the recess portion 154 provided to the first region A1. The connection pad 120 disposed in the first region A1 is lower than the circuit wirings 130 and 140 disposed in the second region A2 or the insulating pattern layer 151 applied to the second region A2. Therefore, a portion of the thickness of the electronic element 80 connected to the connection pad 120 in a direction that is perpendicular to the substrate 110 may be disposed in the recess portion 154. That is, a lower end of the electronic element 80 partly overlaps an upper end of the insulating pattern layer 151 in a direction that is parallel to the substrate 110 and the entire thickness of the electronic element package may be reduced.

FIG. 2 to FIG. 11 show processing cross-sectional views showing a method for manufacturing a circuit board according to an embodiment.

Figure 2:
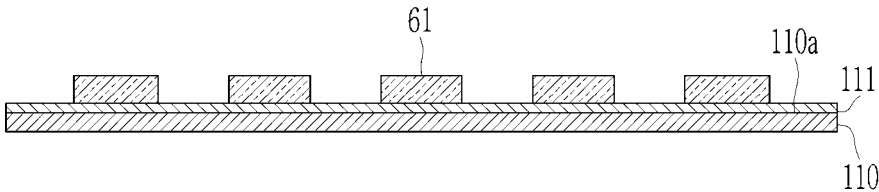
FIG. 2 to FIG. 11 show processing cross-sectional views showing a method for manufacturing a circuit board according to an embodiment.
Figure 3:
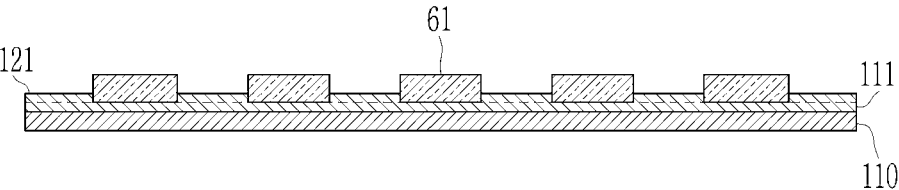

As shown in FIG. 2 and FIG. 3, a first plating resist 61 is applied to the first surface 110*a* of the substrate 110 having a seed layer 111, and is patterned, and a first conductive layer 121 is formed with the first metal. The first plating resist 61 may be patterned by remaining a portion in which the connection pad 120 or the circuit wirings 130 and 140 are not formed and removing other portions.

The substrate 110 may include a resin insulating layer. The substrate 110 may use a thermo-curable resin such as an epoxy resin, a thermoplastic resin such as a polyimide, or a resin, e.g., a prepreg, to which a reinforcing member such as glass fibers or an inorganic filler is impregnated, and may include a thermo-curable resin and/or a photocurable resin, and it is not limited thereto.

A plating process may be performed on the exposed seed layer 111 after patterning the first plating resist 61 to thus form a first conductive layer 121. The seed layer 111 and the first conductive layer 121 may be made of the same material, a first metal, and may include copper (Cu). The first conductive layer 121 may be plated on the exposed portion of the seed layer 111 and may be integrally formed with the seed layer 111. When measuring the height from the first surface 110*a* of the substrate 110 in the direction that is perpendicular to the same, a portion where the first conductive layer 121 is disposed may be higher than the seed layer 111 covered with the first plating resist 61.

Figure 4:
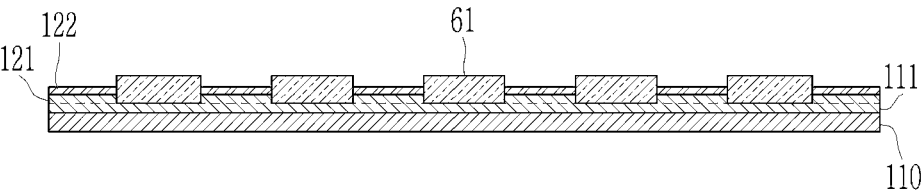

Referring to FIG. 4, a second conductive layer 122 is formed on the first conductive layer 121 with a second metal. The second metal may be different from the first metal, and may include nickel (Ni). The second conductive layer 122 may be plated on the first conductive layer 121 exposed by the first plating resist 61 and may be formed, and may have a same width as the first conductive layer 121.

Figure 5:
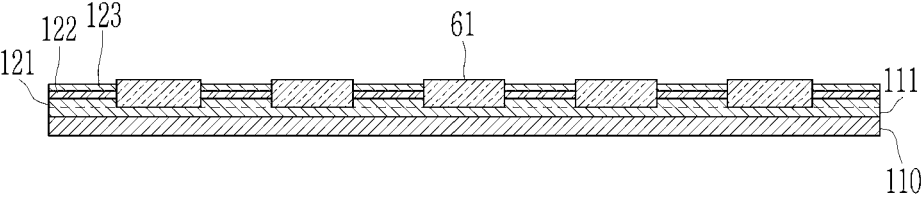

Referring to FIG. 5, a third conductive layer 123 is formed on the second conductive layer 122 with the first metal. As the third conductive layer 123 is made of the first metal, it may be made of the same material as the first conductive layer 121. The third conductive layer 123 may be plated on the second conductive layer 122 exposed by the first plating resist 61 and may be formed, and may have the same width as the second conductive layer 122.

Figure 6:
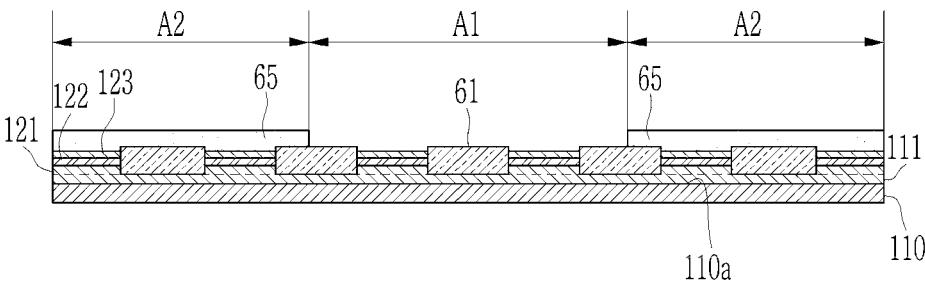

Referring to FIG. 6, the first region A1 and the second region A2 that are different from each other are distinguished on the first surface 110*a* of the substrate 110, and the second region A2 is covered with a second plating resist 65. The second plating resist 65 is applied on the first surface 110*a* of the substrate 110 formed on the first conductive layer 121, the second conductive layer 122, and the third conductive layer 123, and is patterned to distinguish the first region A1 and the second region A2. The second plating resist 65 applied to the first region A1 may be removed by a patterning process. Hence, the third conductive layer 123 disposed in the first region A1 may be exposed to the outside.

The first region A1 may be secured as a region in which the electronic element is mounted.

For example, the first region A1 may be disposed in the center of the first surface 110*a* in a plan view and the second region A2 may be disposed on respective sides of the first region A1 so the electronic element may be mounted in the first region A1.

Figure 7:
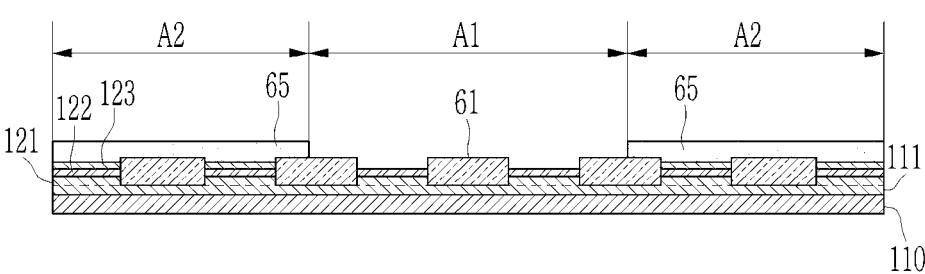
Figure 8:
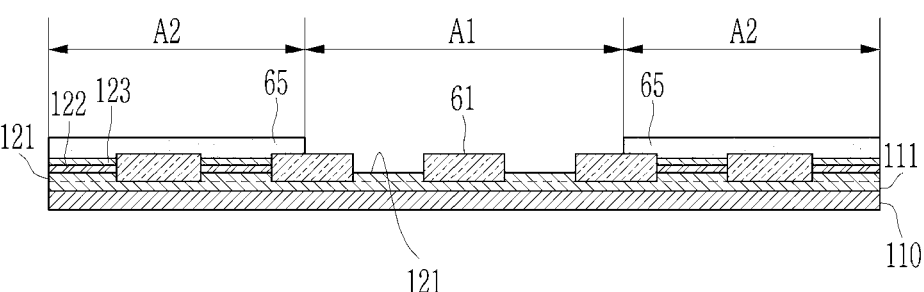

Referring to FIG. 7 and FIG. 8, the second conductive layer 122 and the third conductive layer 123 disposed in the first region A1 are removed. While the second region A2 is covered with the second plating resist 65, the third conductive layer 123 of the first region A1 may be removed by applying a copper etchant (refer to FIG. 7). In this instance, the second conductive layer 122 may be made of nickel and may function as an etching barrier for the copper etchant. While the second region A2 is covered with the second plating resist 65, the second conductive layer 122 of the first region A1 may be removed by applying a nickel etchant (refer to FIG. 8). In this instance, first conductive layer 121 may be made of copper and may function as an etching barrier for the nickel etchant.

When the second conductive layer 122 and the third conductive layer 123 are removed in the first region A1, the first conductive layer 121 may be exposed to the outside. The first conductive layer 121 may form a connection pad 120 by removing the seed layer 111 previously covered with the first plating resist 61 (refer to FIG. 10).

Figure 9:
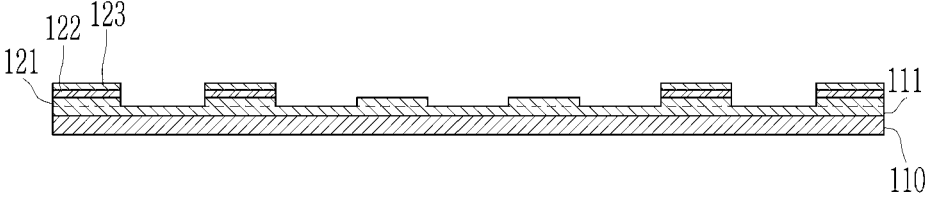

Referring to FIG. 9, the first plating resist 61 and the second plating resist 65 are removed. As the first conductive layer 121 is formed on the seed layer 111 by patterning the first plating resist 61, they are connected to each other by the seed layer 111.

Figure 10:
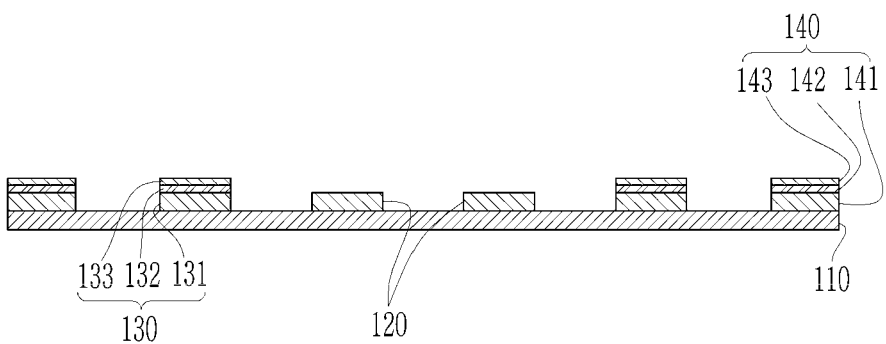

Referring to FIG. 10, a portion of the seed layer 111 where the first conductive layer 121 is not formed is removed. The seed layer 111 may be removed from the substrate 110 by a quick etching. When the seed layer 111 is removed as described, the first conductive layer 121 disposed in the first region A1 forms the connection pad 120, and the first conductive layer 121, the second conductive layer 122, and the third conductive layer 123 disposed in the second region A2 form circuit wirings 130 and 140.

The connection pad 120 may be formed by integrally bonding the first conductive layer 121 and the seed layer 111 disposed below the same. The circuit wirings 130 and 140 may be formed by sequentially stacking the first conductive layer 121, the second conductive layer 122, and the third conductive layer 123 on the seed layer 111. A height of the connection pad 120 may be adjustable depending on a plated amount of the first conductive layer 121. For example, the connection pad 120 may have a height in the range of 2 to 3 $\mu$m, and the circuit wirings 130 and 140 may have a height of approximately 15 $\mu$m.

Figure 11:
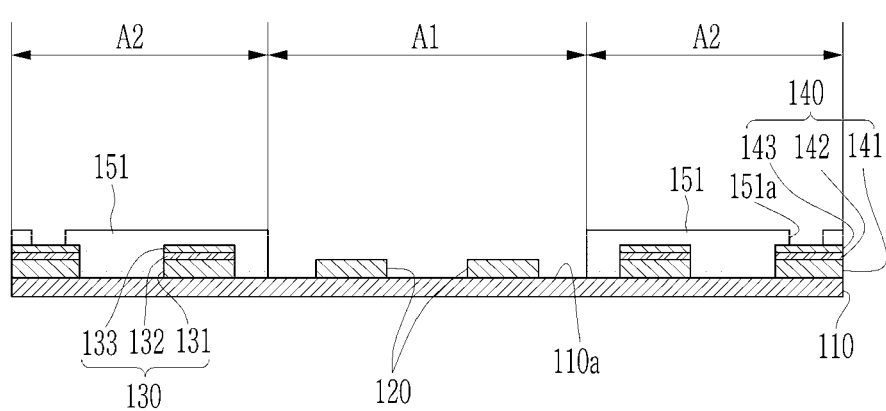

Referring to FIG. 11, an insulating pattern layer 151 may be patterned in the second region A2 and may be accordingly formed. The insulating pattern layer 151 may include an insulation material that is different from the substrate 110, and may include solder resist. The insulating pattern layer 151 may not be formed in the first region A1. The insulating pattern layer 151 may be formed by applying solder resist on the first surface 110a of the substrate 110, and removing the solder resist applied to the first region A1.

The circuit wirings 130 and 140 may include the signal wiring portion 130 and the connection portion 140, and an opening 151a may be formed by partly removing the insulating pattern layer 151 that corresponds to the upper surface of the connection portion 140.

The insulating pattern layer 151 is made of a solder resist layer functions as a protection layer for protecting the outermost circuit, and is formed for the purpose of electrical connection. The insulating pattern layer 151 made of a solder resist layer may be made of, for example, a solder resist ink, a solder resist film, or a capsuling agent according to a person skilled in the art, but is not limited thereto.

While this disclosure has been described in connection with what is presently considered to be practical examples, it is to be understood that the disclosure is not limited to the disclosed embodiments, but, on the contrary, is intended to cover various modifications and equivalent arrangements included within the spirit and scope of the appended claims.

What is claimed is:

1. A circuit board comprising:
a substrate having a first surface including a first region and a second region;
a connection pad disposed in the first region and having a first height in a direction perpendicular to the first surface;
a circuit wiring disposed in the second region, including heterogeneous metal films, and having a second height in the direction perpendicular to the first surface to be greater than the first height; and
an insulating pattern layer protruding from the first surface to have a step from the first region,
wherein in a cross-section of the circuit board, the insulating pattern layer covers an entire upper surface of one pattern of the circuit wiring in the second region, and
a lower surface of the one pattern of the circuit wiring faces the substrate, and the upper surface of the one pattern opposes the lower surface in the direction perpendicular to the first surface.

2. The circuit board of claim 1, wherein the connection pad and the circuit wiring protrude from the first surface.

3. The circuit board of claim 1, wherein the circuit wiring includes a copper layer and a nickel layer.

4. The circuit board of claim 1, wherein the circuit wiring includes sequentially stacked a first copper layer, a nickel layer, and a second copper layer.

5. The circuit board of claim 4, wherein a height of the first copper layer is equal to a height of the connection pad.

6. The circuit board of claim 1, wherein the connection pad includes copper.

7. The circuit board of claim 1, wherein the substrate and the insulating pattern layer include different insulation materials.

8. The circuit board of claim 7, wherein the insulating pattern layer includes a solder resist layer.

9. The circuit board of claim 1, wherein the circuit wiring further includes a connection portion,
the insulating pattern layer includes an opening to expose an upper surface of the connection portion, and
the signal wiring includes the one pattern.

10. The circuit board of claim 1, wherein the first region and the second region are adjacent to each other.

11. The circuit board of claim 10, wherein the first region provides a recess portion surrounded by the insulating pattern layer disposed in the second region.

12. The circuit board of claim 1, further comprising an electronic element disposed in the first region and connected to the connection pad.

13. A method for manufacturing a circuit board comprising:
forming a first conductive layer with a first metal on a first surface of a substrate having a seed layer;
forming a second conductive layer on the first conductive layer with a second metal that is different from the first metal;
forming a third conductive layer on the second conductive layer with the first metal;
defining a first region and a second region that are different from each other on the first surface, and removing the second conductive layer and the third conductive layer disposed in the first region;
forming a connection pad in the first region by removing a portion in which the first conductive layer is not formed from the seed layer, and forming a circuit wiring in the second region; and forming an insulating pattern layer covering the circuit wiring in the second region.

14. The method of claim 13, wherein the forming of the first conductive layer includes applying a first plating resist to pattern the same, and performing a plating with the first metal to form the first conductive layer, the forming of the second conductive layer includes performing a plating with the second metal to form the second conductive layer, and the forming of the third conductive layer includes performing a plating with the first metal to form the third conductive layer.

15. The method of claim 13, wherein the removing of the second conductive layer and the third conductive layer includes covering the second region with second plating resist, and exposing the first region.

16. The method of claim 13, wherein the insulating pattern layer is not formed in the first region.

17. A circuit board comprising:

a substrate;

a plurality of connection pads and a plurality of circuit wiring patterns disposed on the substrate; and an insulating pattern layer covering the plurality of circuit wiring patterns and being spaced apart from the plurality of connection pads, wherein a height of one of the plurality of circuit wiring patterns is greater than a height of one of the plurality of connection pads, and the one of the plurality of circuit wiring patterns has one or more layers more than the one of the plurality of connection pads, in a cross-section of the circuit board, the insulating pattern layer covers an entire upper surface of the one of the plurality of circuit wiring patterns, and a lower surface of the one pattern of the circuit wiring faces the substrate, and the upper surface of the one pattern opposes the lower surface in the direction perpendicular to the first surface.

18. The circuit board of claim 17, wherein the one of the plurality of circuit wiring patterns includes a copper layer and a nickel layer.

19. The circuit board of claim 17, wherein the one of the plurality of circuit wiring patterns includes sequentially stacked a first copper layer, a nickel layer, and a second copper layer.

20. The circuit board of claim 17, wherein the one of the plurality of connection pads and the one of the plurality of circuit wiring patterns each include a copper layer being in contact with the substrate.

* * * * *